United States Patent [19]

Harigaya et al.

[11] Patent Number: 5,620,767
[45] Date of Patent: Apr. 15, 1997

[54] LIGHT REFLECTING AND HEAT DISSIPATING MATERIAL AND OPTICAL INFORMATION RECORDING MEDIUM USING THE SAME

[75] Inventors: Makoto Harigaya, Hiratsuka; Yukio Ide, Mishima; Osamu Nonoyama; Yoshiyuki Kageyama, both of Yokohama; Hiroko Iwasaki, Tokyo, all of Japan

[73] Assignee: Ricoh Company, Ltd., Tokyo, Japan

[21] Appl. No.: 104,373

[22] Filed: Aug. 9, 1993

[30] Foreign Application Priority Data

Aug. 10, 1992 [JP] Japan .................................. 4-234324

[51] Int. Cl.⁶ .................................. G11B 5/66; B32B 3/02
[52] U.S. Cl. .................. 428/64.4; 428/64.5; 428/64.6; 428/457; 428/634 ML; 428/634 RL; 428/900; 428/920; 428/928; 365/122; 360/131; 360/135; 369/288
[58] Field of Search ...................... 428/457, 900, 428/928, 920, 634 ML, 634 RL, 64.4, 64.5, 64.6; 365/122; 360/131, 135; 369/288

[56] References Cited

U.S. PATENT DOCUMENTS 4,717,628  1/1988  Takahashi .................. 428/457
4,786,559  11/1988  Murakami .................. 428/472
4,839,226  6/1989  Sawada .................. 478/336

FOREIGN PATENT DOCUMENTS 0064777  11/1982  European Pat. Off. .
0233034  8/1987  European Pat. Off. .

*Primary Examiner*—Leszek Kiliman
*Attorney, Agent, or Firm*—Cooper & Dunham LLP

[57] ABSTRACT

A light reflecting and heat dissipating material which is capable of reflecting light and dissipating heat transmitted thereto from a layer in contact with or adjacent to the material to cool the layer is composed of an alloy represented by formula (I):

$$Ag_xPd_{1-x} \qquad (I)$$

wherein $0.6 \leq x \leq 0.85$. An optical information recording medium for recording information, reproducing and erasing recorded information is composed of a substrate, a recording layer formed thereon and a light reflection and heat dissipation layer composed of the above light reflecting and heat dissipating material formed on the recording layer.

7 Claims, 1 Drawing Sheet

LIGHT REFLECTING AND HEAT DISSIPATING MATERIAL AND OPTICAL INFORMATION RECORDING MEDIUM USING THE SAME

BACKGROUND OF THE INVENTION

DISCUSSION OF BACKGROUND

A light reflecting and heat dissipating material which is capable of reflecting light and dissipating heat transmitted thereto from a layer in contact with or adjacent to the material to cool the layer is applicable to an optical information recording medium.

For instance, in a phase-change type optical recording method, there are utilized changes in an optical constant of a recording material used in a recording layer of a phase-change type optical recording material, which are caused to occur during the phase transition of the recording material by the application of heat thereto.

More specifically, for example, in the phase-change type optical recording method, recording is carried out as follows:

A chalcogen compound is used as the above-mentioned recording material for the recording layer of the phase-change type optical recording medium. A portion of the recording layer is exposed to a light with an energy which is equal to or more than the energy corresponding to the energy band gap of the chalcogen compound, so that the light is absorbed in the exposed portion. The light absorbed in the exposed portion is converted to heat, so that the temperature of the exposed portion of the recording layer is raised by the heat to fuse the exposed portion. The fused portion is then rapidly cooled so as to assume an amorphous state. The amorphous portion is used as a pit for recording. In order to erase the pit, the amorphous portion is exposed to a light with a power lower than that of the above-mentioned light employed for recording so that the amorphous portion is crystallized.

Thus, the phase-change type optical recording method basically utilizes phase changes between a crystalline state and an amorphous state of a recording material in accordance with an intensity modulation of an incident light to the recording material. Therefore, in the phase-change type optical recording method, it is important how to record information and erase recorded information with high reliability by low-energy light application (i.e., with high recording sensitivity). The improvement of the recording sensitivity depends upon how effectively the light applied to the recording layer is absorbed in the recording layer, and also upon how effectively the heat generated in the recording layer is utilized.

As a specific method for carrying out the above-mentioned improvement, it can be proposed to decrease the thickness of the recording layer, thereby decreasing the heat capacity of the recording layer and reducing the light energy required for recording and erasing information. Also, it can be proposed to most effectively use the light applied to the recording layer by providing a reflection layer on the recording layer so as to cause the light which has passed through the recording layer to perform multiple reflection within the recording layer.

For instance, in Japanese Patent Publication 61-18262, there is proposed a method of the above-mentioned type, in which a chalcogen compound is used in a recording layer, and a metal such as Al, Ag, or Rh is used in a reflection layer. In this method, the light reflection layer has high thermal conductivity, and therefore can rapidly cool the recording medium by conducting heat from the recording layer through the light reflection layer. Thus, the recording medium can easily assume an amorphous state for recording information.

However, when a metal with high thermal conductivity such as Al, Au or Cu is employed alone in the light reflection layer for the recording medium, before the temperature of a recording portion reaches a sufficiently high temperature for information recording (that is, a temperature necessary for fusing the recording portion) the recording medium dissipates heat through the light reflection layer so quickly that the recording sensitivity is lowered, and stable recording cannot be carried out.

There is another proposal for the improvement of the recording sensitivity, in which a metal such as Ti, Cr, Mn or Ni, or a semiconductor material such as Bi, with relatively low thermal conductivity, is used in a light reflection layer as disclosed in Japanese Laid-Open Patent Application 63-58637. In this case, however, unless the thermal conductivity of the material used in the light reflection layer is adequately controlled, there are the risks that (1) the thermal conductivity of the light reflection layer becomes too small to obtain a sufficient cooling effect for causing the recording medium to assume an amorphous state, so that stable information recording cannot be performed, and (2) the reflectivity of the light reflection layer is so decreased that the light reflection layer fails to perform the light reflecting function.

SUMMARY OF THE INVENTION

It is therefore a first object of the present invention to provide a light reflecting and heat dissipating material free from the above-mentioned conventional shortcomings, which has excellent reflection characteristics as well as a rapid cooling effect, without decreasing the recording sensitivity of an optical recording medium, with appropriate heat conduction, even when used therein during the course of recording using the optical recording medium.

A second object of the present invention is to provide an optical information recording medium comprising the above-mentioned light reflecting and heat dissipating material.

The first object of the present invention can be achieved by a light reflecting and heat dissipating material comprising an alloy represented by formula (I):

$$Ag_xPd_{1-x} \qquad (I)$$

wherein $0.6 \leq x \leq 0.85$.

The second object of the present invention can be achieved by an optical information recording medium capable of performing information recording, reproduction and erasure by the application of an electromagnetic wave thereto, comprising a substrate, a recording layer formed thereon and a light reflection and heat dissipation layer formed on the recording layer, the light reflection and heat dissipation layer comprising a light reflecting and heat dissipating material comprising an alloy represented by formula (I):

$$Ag_xPd_{1-x} \qquad (I)$$

wherein $0.6 \leq x \leq 0.85$.

In the above optical information recording medium of the present invention, the information recording, reproduction and erasure can be performed by changing the optical constant of a recording material in the recording layer by the application of an electromagnetic wave to the recording layer.

In order to attain the second object of the present invention, it is preferable that the optical information recording medium comprise a light reflection and heat dissipation layer with a reflectance of 70% or more with respect to a light with a wavelength of 680 nm or more.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
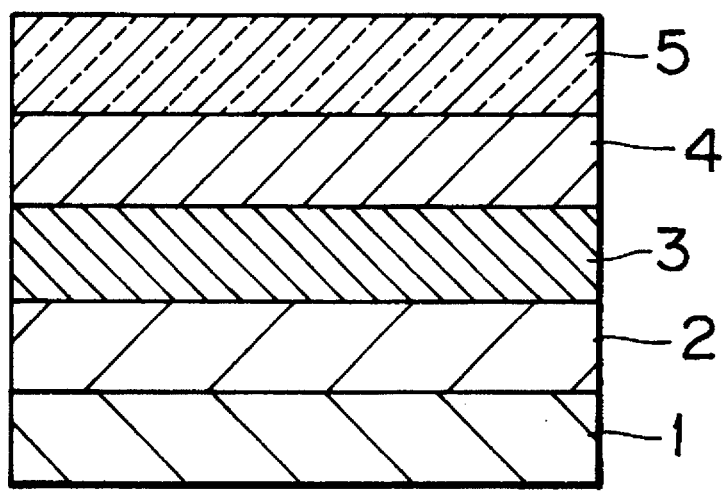
FIG. 1 is a schematic cross-sectional view of an example of an optical information recording medium according to the present invention.

The present invention is based on the inventors' discovery that an alloy of (1) Ag with high reflectance and high thermal conductivity and (2) Pd, represented by formula (I)

$$Ag_xPd_{1-x} \qquad (I)$$

wherein $0.6 \leq x \leq 0.85$, is suitable for a light reflecting and heat dissipating material for use in a light refection and heat dissipation layer for an optical information recording medium, which is capable of performing information recording, reproduction and erasure by the application of an electromagnetic wave thereto, and comprises a substrate, a recording layer formed thereon and the light reflection and heat dissipation layer formed on the recording layer, the light reflection and heat dissipation layer comprising the above-mentioned light reflecting and heat dissipating material, which is also an optical information recording medium of the present invention.

This is because the above alloy has a sufficient reflectance for the light reflecting and heat dissipating material, and a sufficient heat conductivity for rapidly cooling the recording layer, which is necessary for making the recording layer amorphous when recording is performed, thereby making the recording medium highly sensitive to recording operation.

Furthermore, the above alloy is resistant to sulfiding, although Ag itself when used alone is vulnerable to sulfiding. More specifically, as specified in the above formula (I) the AgPd alloy, the value of x is in the range of 0.6 to 0.85. When x is less than 0.6, the thermal conductivity of the alloy is so decreased that it is not suitable for use in practice, while when the value of x is more than 0.85, the sulfiding of the alloy tends to occur easily. In this sense, it is more preferable that the value of x be in the range 0.6 to 0.7.

In the above-mentioned optical information recording medium of the present invention, the information recording, reproduction and erasure can be performed by changing the optical constant of a recording material contained in the recording layer by the application of an electromagnetic wave to the recording layer.

It is preferable that the reflectance of the light reflection and heat dissipation layer of the above-mentioned information recording medium be 70% or more when the layer is exposed to a light with a wavelength of 680 nm or more.

The light reflecting and heat dissipating material comprising the AgPd alloy according to the present invention is preferably employed in an optical element such as an optical disc. Particularly when the AgPd alloy is employed in a light reflection and heat dissipation layer for a phase-change type optical disc, it is also desirable that the reflectance of the light reflection and heat dissipation layer be 70% or more with the light with a wavelength of 680 or more.

Furthermore, the thermal conductivity of the light reflecting and heat dissipating material comprising the AgPd alloy of the present invention can be widely changed in the range of 0.17 W/cm.K to 3.2 W/cm.K, with the high reflectance thereof being maintained, by appropriately adjusting the composition of the AgPd alloy. Therefore, it is possible to provide an optical information recording medium comprising the light reflecting and heat dissipating material that can be used at the line speeds of the conventional optical discs.

For instance, when high speed input and output of information is required as in a computer memory, it is necessary to increase the line speed of the optical disc. In such a case, when a recording laser power is constant, the light irradiation energy per unit area per unit time is smaller than that at a lower line speed. Therefore, in order to improve the heat accumulation effect of the light reflecting and heat dissipating layer, it is necessary to adjust the components thereof so as to have a thermal conductivity in the range of $2.0 \times 10^{-1}$ W/cm.K to $9.5 \times 10^{-1}$ W/cm.K. Thus, the light reflecting and heat dissipating material can be applied to an information recording medium with a line speed of 7 m/sec or more.

Furthermore, when the light reflecting and heat dissipating material is employed in a compact disc (CD) for sound or picture memory, the line speed thereof is slow, so that it is necessary to improve heat dissipation effect. In this case, it is necessary to adjust the composition of the light reflecting and heat dissipating material so as to have a thermal conductivity of 1.8 W/cm.K to 3.2 W/cm.K, whereby the heat dissipation effect of the material can be improved and a rapid cooling effect can be obtained which is required for recording by making an exposed portion amorphous. The above-mentioned light reflecting and heat dissipating material can be applied to an optical information recording medium with a line speed as low as 2 m/sec or less.

Furthermore, the light reflecting and heat dissipating material according to the present invention is prevented from corroding since Pd is contained therein, although Ag itself is easily corroded by sulfiding. Therefore, the advantages of Ag over other metals, such as having the largest reflectance and highest thermal conductivity among all metals can be most effectively utilized in the light reflecting and heat dissipating material of the present invention.

The light reflecting and heat dissipating material according to the present invention can be preferably employed in the phase-change type optical information recording medium as mentioned previously. In addition, the light reflecting and heat dissipating material can fully exhibit its characteristics when used in a light reflection layer for a magneto-optical recording medium comprising a magneto-optical information recording material such as an Tb—Fe—Co alloy or a Gd—Tb—Co alloy.

In the case of a magneto-optical recording medium, it is necessary to design the medium so as to have a large Kerr rotation angle or Faraday rotation angle for reproducing signals from the recording medium. This can be done, for instance, by utilizing the phenomenon that the Faraday effect can be doubled by causing a reproduction light to reciprocate within a recording layer. In order to accomplish this, it is necessary to decrease the thickness of the recording layer and to provide a reflection layer through which the light which has passed through the recording layer is reflected to return to the recording layer. It is required the reflectance of such a reflection layer be as high as possible.

For instance, when Ag having the highest reflectance and the largest thermal conductivity among all metals is used alone in a light reflection layer in an optical information recording medium, there is the risk that the heat dissipation through the light reflection layer becomes excessive, so that the recording sensitivity of the optical information recording medium is decreased, depending upon the line speed of the optical information recording medium.

On the other hand, when the AgPd alloy serving as the light reflecting and heat dissipating material of the present invention is used, the thermal conductivity of the light reflection and heat dissipation layer can be appropriately controlled with the high reflectance maintained, so that the recording performance can be exhibited without decreasing the recording sensitivity.

FIG. 1 is a schematic cross-sectional view of an example of an optical information recording medium according to the present invention. In the recording medium shown in FIG. 1, a first heat resistant protective layer 2, a recording layer 3, a second heat resistant protective layer 4 and a light reflection and heat dissipation layer 5 are successively overlaid on a substrate 1. The optical information recording medium according to the present invention is not limited to this example.

Obviously, numerous additional modifications and variations of the present invention are possible in light of the above teachings. It is therefore to be understood that within the scope of the appended claims, the invention may be practiced otherwise than as specifically described herein.

The substrate 1 for use in the present invention is generally made of glass, ceramics or a resin. The substrate 1 made of a resin is preferably employed in the present invention in view of the molding properties of the material and the manufacturing cost.

Representative examples of the resin include polycarbonate resin, acrylic resin, epoxy resin, polystyrene resin, acrylonitrile—styrene copolymer resin, polyethylene resin, polypropylene resin, silicone resin, fluorocarbon resin, ABS resin and urethane resin.

Of the above resins, polycarbonate resin and acrylic resin are preferably employed in view of the processing characteristics and optical characteristics.

Moreover, the substrate 1 may be in the form of a disc, card or sheet.

As materials for the first and second heat-resistant protective layers 2 and 4, metallic oxides such as SiO, $SiO_2$, ZnO, $SnO_2$, $Al_2O_3$, $TiO_2$, $In_2O_3$, MgO, and $ZrO_2$; nitrides such as $Si_3N_4$, AlN, TiN, BN and ZrN; sulfides such as ZnS, $In_2S_3$ and $TaS_4$; carbides such as SiC, TaC, $B_4C$, WC, TiC, and ZrC; diamond-type carbon; and mixtures of these can be employed.

If necessary, the first and second heat-resistant protective layers 2 and 4 may comprise impurities.

The first and second heat-resistant protective layers 2 and 4 can be prepared by a variety of vapor phase film formation methods such as the vacuum deposition method, the sputtering method, the plasma enhanced CVD, the optical CVD method, the ion plating method, and the electron beam deposition method.

It is preferable that the first and second heat-resistant protective layers 2 and 4 have a thickness in the range of 200 to 5000 Å, more preferably in the range of 500 to 3000 Å.

When the first and second heat-resistant protective layers 2 and 4 have the thickness in the above-mentioned range, the first and second heat-resistant protective layers 2 and 4 satisfactorily function without causing any decrease in the sensitivity of the recording layer 3 and the peeling-off thereof.

Moreover, it is possible to provide multiple numbers of heat-resistant protective layers in the optical information recording medium of the present invention.

Any phase-change type materials can be employed in the recording layer 3 so long as the optical constants thereof are changed when an electromagnetic wave is applied thereto, whereby information recording reproduction and erasure can be performed.

It is preferable that the recording layer 3 be prepared by use of the sputtering method. It is also preferable that the thickness of the recording layer 3 be in the range of 100 to 2000 Å, more preferably in the range of 200 to 1000 Å.

When the thickness of the recording layer 3 is in the above-mentioned range, appropriate recording and erasing sensitivities can be obtained without impairing the characteristics of the materials employed in the recording layer 3.

The light reflecting and heat dissipating material comprising the alloy represented by the previously mentioned formula (I) of the present invention is employed in the light reflection and heat dissipation layer 5, which constitutes a key feature of the optical information recording medium of the present invention.

It is preferable that the light reflection and heat dissipation layer 5 be formed by the vacuum deposition method or the sputtering method. In the present invention, it is preferable that the thickness of the light reflection and heat dissipation layer 5 be in the range of 300 to 2000 Å, more preferably in the range of 500 to 1000 Å, although the most appropriate thickness of the light reflection and heat dissipation layer 5 varies depending upon the heat capacity of the light reflecting and heat dissipating material employed in the light reflection and heat dissipation layer 5 and the reflectance thereof.

When the thickness of the light reflection and dissipation layer 5 is in the above-mentioned range, the thermal conductivity of the light reflection and heat dissipation layer 5 is appropriate so that the recording and erasing sensitivities are satisfactorily maintained.

Examples of the electromagnetic wave for use in the present invention for recording information, and reproducing and erasing recorded information, include laser beam, electron radiation, x-ray, ultraviolet light, visible light, infrared radiation and microwave.

Of the above-mentioned electromagnetic waves, semiconductor laser beam is most suitable for use in the present invention in view of the small size of a laser beam emitting source.

Other features of this invention will become apparent in the course of the following description of exemplary embodiments, which are given for illustration of the invention and are not intended to be limiting thereof.

In the following Examples and Comparative Example, the ratios in the compositions are based on atom. %.

EXAMPLE 1

On a polycarbonate substrate with a thickness of 1.2 mm and a diameter of 86 mm, provided with a guide groove with a track pitch of 1.6 µm and a depth of 700 Å, a first heat-resistant protective layer, a recording layer, a second heat-resistant protective layer and a light reflection and heat dissipation layer, each comprising a material as shown in TABLE 1 and having a thickness as shown in TABLE 1, were successively overlaid by the rf sputtering method, so that a disc-shaped optical information recording medium No. 1 of the present invention was fabricated.

When the light reflection and heat dissipation layer was formed on the second heat-resistant protective layer, a cover glass with a thickness of 1 mm and a size of 20 mm×20 mm was attached to the second heat-resistant protective layer for the measurement of the thermal conductivity thereof in the course of the formation of the light reflection and heat dissipation layer.

The thermal conductivity and reflectivity of the light reflection and heat dissipation layer of the optical information recording medium No. 1 of the present invention are shown in TABLE 2.

When the light reflection and heat dissipation layer was too thin to directly measure the thermal conductivity thereof, the electric conductivity of the light reflection and heat dissipation layer was measured by use of the four-terminal network method and the obtained value was converted to the thermal conductivity in accordance with Wiedemann-Franz's law.

EXAMPLE 2 AND 3 AND COMPARATIVE EXAMPLE

The procedure for Example 1 was repeated except that the materials for the first heat-resistant protective layer, the recording layer, the second heat-resistant protective layer and the light reflection and heat dissipation layer in Example 1 were replaced with the respective materials shown in TABLE 1, with the thicknesses of the respective layers set as shown in TABLE 1, whereby optical information recording media Nos. 2 and 3 and a comparative optical information recording medium were fabricated.

The thermal conductivity and reflectance of each light reflection and heat dissipation layer in the optical information recording media Nos. 2 and 3 of the present invention and the comparative optical information recording medium are shown in TABLE 2.

TABLE 2

| | Light Reflection and Heat Dissipation Layer | | |
|---|---|---|---|
| | Material | Thermal Conductivity (W/cm · K) | Reflectance (%) |
| Ex. 1 | $Ag_{0.85}Pd_{0.15}$ | 1.92 | 89 |
| Ex. 2 | $Ag_{0.75}Pd_{0.25}$ | 0.61 | 81 |
| Ex. 3 | $Ag_{0.65}Pd_{0.35}$ | 0.17 | 75 |
| Comp. Ex. | Ag | 3.21 | 98 |

Each of the thus obtained optical information recording media Nos. 1 to 3 according to the present invention and the comparative optical information recording medium was evaluated by applying thereto a semiconductor laser beam with a wavelength of 830 nm through a lens with a numerical aperture (NA) of 0.5 from the substrate side, with the beam being concentrated to a spot with a diameter of 1 µm at the surface of each recording medium.

The recording layer of each of the optical information recording media Nos. 1 to 3 and the comparative optical information recording medium assumed an amorphous state after the fabrication thereof.

Prior to the evaluation of each of the optical information recording media Nos. 1 to 3 and the comparative optical information recording medium, each recording layer was sufficiently crystallized in its entirety to cause each recording medium to assume an initialized (unrecorded) state, by the application of a DC light with an intensity of 4 to 10 mW at the surface thereof.

The line speed of each of the optical information recording media Nos. 1 to 3 and the comparative optical information recording medium was set at 2 m/s, 7 m/s and 11 m/s.

For recording, a semiconductor laser beam was applied to each recording medium, with the frequency thereof set at 1.14 MHz, 3.7 MHz and 5.8 MHz, and with a writing laser power (Pw) thereof changed from 7 to 17 mW.

A recording laser power (Pr) applied to each recording medium was set at 1.0 mW.

TABLES 3, 4 and 5 show a writing laser power Pw when the C/N value was saturated or maximized, an optimum erasing power Pe, the C/N value and the erasure ratio obtained for each line speed.

TABLE 1

| | | First Heat-resistant Protective Layer | Recording Layer | Second Heat-resistant Protective Layer | Light Reflection and Heat dissipation Layer |
|---|---|---|---|---|---|
| Ex. 1 | Material | $Si_3N_4$ | $(AgInTe_2)_{0.3}Sb_{0.7}$ | $Si_3N_4$ | $Ag_{0.85}Pd_{0.15}$ |
| | Thickness | 2000 Å | 1000 Å | 1000 Å | 800 Å |
| Ex. 2 | Material | $Si_3N_4$ | $(AgInTe_2)_{0.3}Sb_{0.7}$ | $Si_3N_4$ | $Ag_{0.75}Pd_{0.25}$ |
| | Thickness | 2000 Å | 1000 Å | 1000 Å | 800 Å |
| Ex. 3 | Material | $Si_3N_4$ | $(AgInTe_2)_{0.3}Sb_{0.7}$ | $Si_3N_4$ | $Ag_{0.65}Pd_{0.35}$ |
| | Thickness | 2000 Å | 1000 Å | 1000 Å | 800 Å |
| Comp. Ex. | Material | $Si_3N_4$ | $(AgInTe_2)_{0.3}Sb_{0.7}$ | $Si_3N_4$ | Ag |
| | Thickness | 2000 Å | 1000 Å | 1000 Å | 800 Å |

TABLE 3

[Line Speed: 2 m/s, Frequency: 1.14 MHz]

| Light Reflecting and Heat Dissipating Material | Pw (mW) | Pe (mW) | C/N (dB) | Erasing Ratio (–dB) |
|---|---|---|---|---|
| Ex. 1 | $Ag_{0.85}Pd_{0.15}$ | 10 | 6 | 52 | 48 |
| Ex. 2 | $Ag_{0.75}Pd_{0.25}$ | 8 | 5 | 39 | 21 |
| Ex. 3 | $Ag_{0.65}Pd_{0.35}$ | 7 | 5 | 23 | 9 |
| Comp. Ex. | Ag | 11 | 7 | 56 | 54 |

TABLE 4

[Line Speed: 7 m/s, Frequency: 3.7 MHz]

| Light Reflecting and Heat Dissipating Material | Pw (mW) | Pe (mW) | C/N (dB) | Erasing Ratio (–dB) |
|---|---|---|---|---|
| Ex. 1 | $Ag_{0.85}Pd_{0.15}$ | 11 | 7 | 53 | 49 |
| Ex. 2 | $Ag_{0.75}Pd_{0.25}$ | 9 | 6 | 44 | 30 |
| Ex. 3 | $Ag_{0.65}Pd_{0.35}$ | 8 | 6 | 40 | 20 |
| Comp. Ex. | Ag | 13 | 7 | 55 | 51 |

TABLE 5

[Line Speed: 11 m/s, Frequency: 5.8 MHz]

| Light Reflecting and Heat Dissipating Material | Pw (mW) | Pe (mW) | C/N (dB) | Erasing Ratio (–dB) |
|---|---|---|---|---|
| Ex. 1 | $Ag_{0.85}Pd_{0.15}$ | 13 | 7 | 54 | 50 |
| Ex. 2 | $Ag_{0.75}Pd_{0.25}$ | 11 | 6 | 55 | 51 |
| Ex. 3 | $Ag_{0.65}Pd_{0.35}$ | 10 | 6 | 48 | 39 |
| Comp. Ex. | Ag | 15 | 8 | 53 | 49 |

TABLE 6 shows the anti-sulfiding characteristics of each of the light reflecting and heat dissipating materials employed in Examples 1 to 3 of the present invention and Comparative Example.

For investigating the anti-sulfiding characteristics of each light reflecting and heat dissipating material, each light reflecting and heat dissipating material was applied to a glass substrate to form a light reflecting and heat dissipating material layer with a thickness of 1000 Å, and the light reflecting and heat dissipating material layer was coated with epoxy resin. The thus coated light reflecting and heat dissipating materials were allowed to stand in a diluted hydrogen sulfide gas with a concentration of 12.5 ppm, at 25° C. with a humidity of 75%, for 300 hours, and were then taken out therefrom, so compare the respective reflectances before and after the exposure to the hydrogen sulfide gas. The results are shown in TABLE 6.

TABLE 6

| Light Reflecting and Heat Dissipating Material | Initial Reflectance (%) | Reflectance (%) after 300 hrs. |
|---|---|---|
| $Ag_{0.85}Pd_{0.15}$ | 89 | 71 |
| $Ag_{0.75}Pd_{0.25}$ | 81 | 71 |
| $Ag_{0.65}Pd_{0.35}$ | 77 | 74 |
| Ag | 98 | 41 |

As is obvious from the results shown in TABLES 1 to 5, the thermal conductivity of the light reflection and heat dissipation layer composed of a AgPd alloy can be controlled by adjusting the composition of the AgPd alloy, and at the same time, the light reflection and heat dissipation layer satisfactorily functions as a reflection layer.

In the case where such a light reflection and heat dissipation layer is employed in a phase-change type optical information recording medium (or disk), the optical information recording disk can be employed without decreasing the characteristics thereof even by changing the line speed thereof from a low speed (2 m/s or less) to a medium high speed (7 m/s or more), if the thermal conductivity thereof is controlled appropriately, so that it is possible to provide a phase-change type recording medium applicable to a desired information recording system.

The results shown in TABLE 6 also indicate that the sulfiding resistant characteristics of the light reflecting and heat dissipating materials according to the present invention are largely improved by the addition of Pd to Ag in comparison with the comparative light reflecting and heat dissipating material made of Ag.

Furthermore, a light reflection layer comprising the AgPd alloy of the present invention, when employed in a magneto-optical information recording medium comprising a magneto-optical recording material represented by Tb—Fe—Co or Gd—Tb—Co, is sufficiently useful as a light reflection layer for such a magneto-optical information recording medium.

The light reflecting and heat dissipating material of the present invention can be advantageously employed as a light reflecting and heat dissipating material for an optical element, particularly for a phase-change type optical information recording medium, since the thermal conductivity thereof can be controlled by adjusting the composition of the AgPd alloy, while maintaining its high reflectance.

Moreover, it is possible to prevent the corrosion of the light reflecting and heat dissipating material by the addition of Pd thereto, although Ag has a problem of corrosion by sulfiding, so that the high reflectance and high thermal conductivity of Ag can be effectively utilized in the light reflecting and heat dissipating material of the present invention.

The thermal conductivity of the AgPd alloy of the present invention can be largely adjusted as mentioned above. Therefore when the AgPd alloy is used in a light reflection and heat dissipation layer for an optical information recording medium in the shape of a disk, a highly sensitive optical information recording disk which corresponds to the line speed thereof can be provided.

What is claimed is:

1. A light reflecting and heat dissipating material comprising an alloy represented by formula (I):

$$Ag_xPd_{1-x} \quad (I)$$

wherein $0.6 \leq x \leq 0.85$.

2. An optical information recording medium for performing information recording, reproduction and erasure by the application of electromagnetic wave thereto, comprising a substrate, a recording layer comprising a recording material overlying said substrate and a light reflection and heat dissipation layer overlying said recording layer, said light reflection and heat dissipation layer comprising a light reflecting and heat dissipating material comprising an alloy represented by formula (I):

$$Ag_xPd_{1-x} \quad (I)$$

wherein $0.6 \leq x \leq 0.85$.

3. The optical information recording medium as claimed in claim 2, wherein said recording layer is a layer for performing information recording, reproduction and erasure by changing the optical constant of said recording material by the application of an electromagnetic wave to said recording layer.

4. The optical information recording medium as claimed in claim 2, wherein the reflectance of said light reflection and heat dissipation layer is at least 70% with respect to a light with a wavelength of at least 680 nm.

5. The optical information recording medium as claimed in claim 2, wherein said recording layer is a phase-change recording layer.

6. The optical information recording medium as claimed in claim 2, wherein said recording layer comprises $(AgInTe_2)_{0.3}Sb_{0.7}$ as said recording material.

7. The optical information recording medium as claimed in claim 3, wherein the reflectance of said light reflection and heat dissipation layer is at least 70% with respect to a light with a wavelength of at least 680 nm.

* * * * *